(12) United States Patent
Nakai

(10) Patent No.: US 8,972,474 B2
(45) Date of Patent: Mar. 3, 2015

(54) LOGARITHMIC/INVERSE-LOGARITHMIC CONVERSION CIRCUIT

(75) Inventor: Toshimitsu Nakai, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 288 days.

(21) Appl. No.: 13/534,265

(22) Filed: Jun. 27, 2012

(65) Prior Publication Data

US 2013/0110896 A1 May 2, 2013

(30) Foreign Application Priority Data

Nov. 1, 2011 (JP) ................................. 2011-240182

(51) Int. Cl.
 G06F 7/556 (2006.01)
 H03M 7/50 (2006.01)

(52) U.S. Cl.
 CPC ........ *G06F 7/556* (2013.01); *H03M 7/50* (2013.01)
 USPC .......................................... 708/851; 708/801

(58) Field of Classification Search
 USPC ................................................ 708/800–854
 See application file for complete search history.

(56) References Cited

U.S. PATENT DOCUMENTS

| 3,676,661 | A | * | 7/1972 | Sprowl ........................ | 708/838 |
|---|---|---|---|---|---|
| 3,895,265 | A | * | 7/1975 | Watrous ...................... | 361/249 |
| 4,338,589 | A | * | 7/1982 | Engel et al. ................. | 341/120 |
| 8,443,017 | B2 | * | 5/2013 | Suzuki et al. ............... | 708/200 |
| 2011/0260710 | A1 | * | 10/2011 | Zhu et al. .................. | 324/123 R |

FOREIGN PATENT DOCUMENTS

| JP | 63-064405 A | 3/1988 |
|---|---|---|
| JP | 2-63464 U | 5/1990 |
| JP | 6-035975 U | 5/1994 |
| JP | 7-288439 A | 10/1995 |
| JP | 8-084038 A | 3/1996 |

OTHER PUBLICATIONS

George Clayton and Steve Winder, Operational Amplifiers, Appendix A1, 2003, Newnes, 5th Edition, pp. 304-315.*

* cited by examiner

*Primary Examiner* — Chat Do
*Assistant Examiner* — Calvin M Brien
(74) *Attorney, Agent, or Firm* — Buchanan Ingersoll & Rooney PC

(57) ABSTRACT

A logarithmic conversion circuit comprises: an operation amplifier; an input resistor connected at a preceding stage of an inverting input terminal, of the operation amplifier, to which a current signal is inputted; and a logarithmic conversion device and a current feedback device connected in series between the inverting input terminal and an output terminal of the operation amplifier, and an inverse-logarithmic conversion circuit comprises: a current/voltage conversion circuit which, after the current signal having passed through the current feedback device is inputted, converts the inputted current signal to a voltage value corresponding thereto; and a subtraction circuit outputting the difference between an output voltage of the current/voltage conversion circuit and a predetermined reference voltage, a circuit constant of the subtraction circuit being set such that the difference output of the subtraction circuit has a linearity proportional to the current signal.

6 Claims, 5 Drawing Sheets

LOGARITHMIC/INVERSE-LOGARITHMIC CONVERSION CIRCUIT

BACKGROUND OF THE INVENTION

1. Field of the Invention

The present invention relates to a logarithmic/inverse-logarithmic conversion circuit which, for example, in radiation measurement or the like, performs logarithmic conversion and inverse-logarithmic conversion for a current signal outputted from a pulse detector for detecting radiation.

2. Description of the Background Art

A detector such as a proportional counter for detecting radiation such as a neutron outputs a pulse signal having a pulse count corresponding to the radiation intensity. The pulse signal is amplified by a pre-amplifier or the like. Then, the amplified pulse signal is converted to a current signal corresponding to the pulse count of the pulse signal by a frequency/current convertor, and the current signal is outputted. As a signal processing circuit for processing such a current signal, a logarithmic/inverse-logarithmic conversion circuit is known which has a combination of an operation amplifier and a transistor and uses a logarithmic characteristic and an inverse-logarithmic characteristic of the transistor (for example, see Patent Document 1).

Here, the reason for providing the logarithmic conversion circuit is that the pulse count outputted from the pulse detector has a wide dynamic range about from $10^0$ counts per second (cps) to $10^6$ cps, and that therefore it is necessary to compress a signal by logarithmic conversion so as to facilitate subsequent signal processing. On the other hand, the reason for the inverse-logarithmic conversion circuit performing inverse-logarithmic conversion for the output signal obtained by logarithmic conversion in the logarithmic conversion circuit is that it is necessary to adjust the gains of a certain range of output signals and closely observe their characteristics.

Patent Document 1: Japanese Laid-Open Utility Model Publication No. 2-63464

The conventional logarithmic/inverse-logarithmic conversion circuit uses a logarithmic/inverse-logarithmic characteristic of a transistor or the like. Therefore, it is necessary to always perform temperature correction in order to keep the linearity of, particularly, the output signal obtained by inverse-logarithmic conversion in the inverse-logarithmic conversion circuit after logarithmic conversion. Thus, a problem of extra time and work for the correction occurs.

SUMMARY OF THE INVENTION

The present invention has been made to solve the above problem. An object of the present invention is to provide a logarithmic/inverse-logarithmic conversion circuit capable of keeping the linearity of the output signal obtained by inverse-logarithmic conversion in the inverse-logarithmic conversion circuit, without temperature correction.

A logarithmic/inverse-logarithmic conversion circuit according to the present invention comprises: a logarithmic conversion circuit which performs logarithmic conversion for an inputted current signal and outputs the resultant current signal; and an inverse-logarithmic conversion circuit which performs inverse-logarithmic conversion for the current signal that has passed through the logarithmic conversion circuit and outputs the resultant current signal. The logarithmic conversion circuit comprises: an operation amplifier; an input resistor connected at a preceding stage of an inverting input terminal, of the operation amplifier, to which the current signal is inputted; and a device for logarithmic conversion and a device for current feedback connected in series between the inverting input terminal and an output terminal of the operation amplifier. The inverse-logarithmic conversion circuit comprises: a current/voltage conversion circuit to which the current signal that has passed through the device for current feedback is inputted and which converts the inputted current signal to a voltage value corresponding to the inputted current signal; and a subtraction circuit which outputs the difference between an output voltage of the current/voltage conversion circuit and a predetermined reference voltage. A circuit constant of the subtraction circuit is set such that the difference output of the subtraction circuit has a linearity proportional to the current signal.

According to the logarithmic/inverse-logarithmic conversion circuit of the present invention, when an inputted current signal is processed by inverse-logarithmic conversion in the inverse-logarithmic conversion circuit, the linearity of the output signal obtained by the inverse-logarithmic conversion can be kept without temperature correction. Therefore, it becomes possible to reduce conventional extra time and work for temperature correction.

The foregoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

Figure 5:
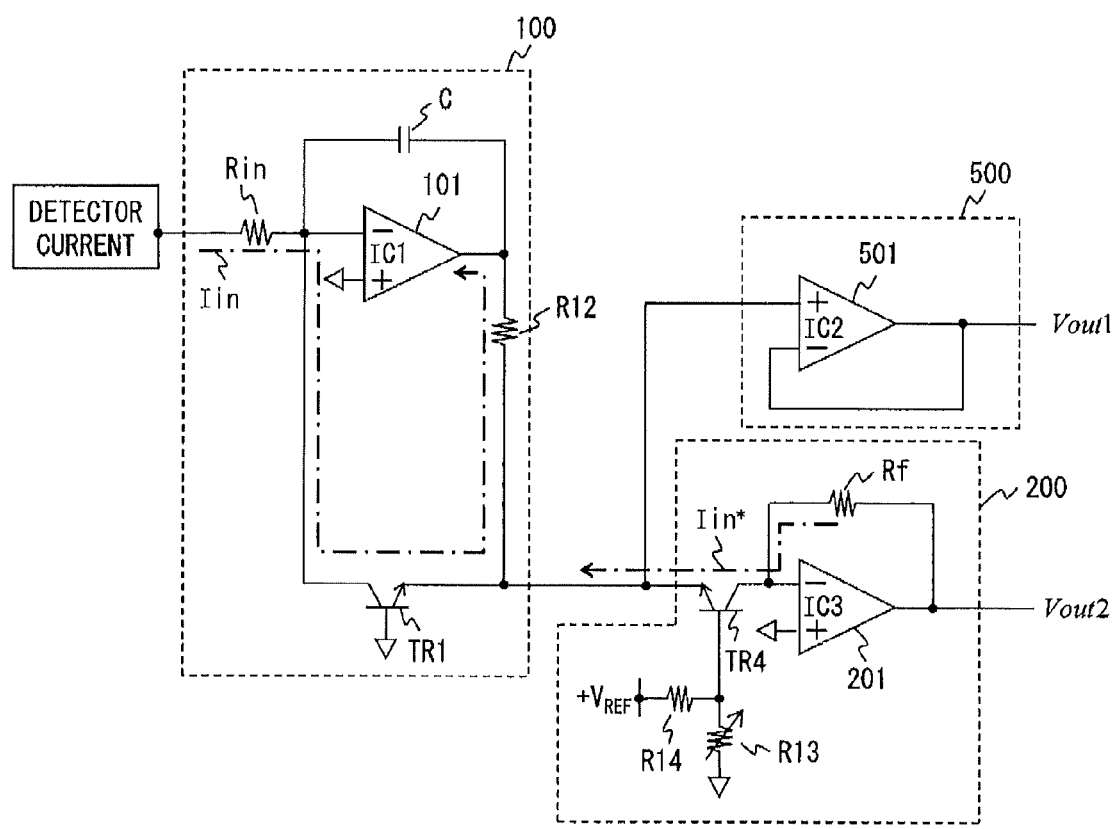
FIG. 5 is a circuit diagram showing the configuration of a logarithmic/inverse-logarithmic conversion circuit.

First, a logarithmic/inverse-logarithmic conversion circuit will be described in detail. FIG. 5 is a circuit diagram showing the configuration of the logarithmic/inverse-logarithmic conversion circuit. With reference to FIG. 5, the logarithmic conversion circuit 100 is composed of an input resistor Rin, an operation amplifier 101, a capacitor C, a transistor TR1 for logarithmic conversion, and a feedback resistor R12. An output voltage Vout1 of the logarithmic conversion circuit 100 is represented as the following expression.

$$V\text{out}1 = (KT/q) \cdot \ln(Ir/\text{Iin}) \qquad (1)$$

In the above expression, K is Boltzmann constant, T is absolute temperature, q is electric charge, Iin is a current flowing in the transistor TR1 for logarithmic conversion via the input resistor Rin as indicated by a dotted-dashed line, and Ir is an interrupting current between the collector and the base of the transistor TR1 for logarithmic conversion.

The output voltage Vout1 obtained by logarithmic conversion in the logarithmic conversion circuit 100 is outputted as a logarithmic-converted detection signal via a buffer circuit 500 composed of an operation amplifier 501.

The inverse-logarithmic conversion circuit 200 is composed of a transistor TR4 for inverse-logarithmic conversion, an operation amplifier 201, a feedback resistor Rf, a variable resistor R13 for temperature correction, and a voltage division resistor R14. An output voltage Vout2 of the inverse-logarithmic conversion circuit 200 is represented as the following expression (2).

$$Vout2 = Iin^* \cdot Rf \cdot \exp\{V_{REF} \cdot (q/KT) \cdot R13/(R13+R14)\} \quad (2)$$

In the above expression, K is Boltzmann constant, T is absolute temperature, q is electric charge, Iin* is a current flowing via the feedback resistor Rf as indicated by a dotted-dashed line along with the current Iin flowing in the transistor TR1 for logarithmic conversion, and $V_{REF}$ is a reference voltage applied to the voltage division resistor R14.

Here, since expressions (1) and (2) each include a term of the absolute temperature T, the output voltage Vout1 of the logarithmic conversion circuit 100, and the output voltage Vout2 of the inverse-logarithmic conversion circuit 200 are both influenced by the temperature. Particularly, if the output voltage Vout2 of the inverse-logarithmic conversion circuit 200 is influenced by the temperature, the linearity cannot be kept and the detection accuracy is adversely affected.

Considering the above, in the circuit shown in FIG. 5, in the case where the output voltage Vout1 varies owing to the temperature characteristic of the logarithmic conversion circuit 100, the resistance value of the variable resistor R13 is adjusted such that the current signal Iin* flowing via the feedback resistor Rf coincides with the current signal Iin flowing in the transistor TR1 for logarithmic conversion, thus performing temperature correction so as to keep the linearity of the output voltage Vout2 of the inverse-logarithmic conversion circuit 200.

As described above, the logarithmic/inverse-logarithmic conversion circuit shown in FIG. 5 uses a logarithmic/inverse-logarithmic characteristic of a transistor or the like. Therefore, it is necessary to always perform temperature correction in order to keep the linearity of, particularly, the output signal obtained by inverse-logarithmic conversion in the inverse-logarithmic conversion circuit after logarithmic conversion. Thus, a problem of extra time and work for the correction occurs.

The present invention makes it possible to keep the linearity of the output signal obtained by inverse-logarithmic conversion in the inverse-logarithmic conversion circuit, without such temperature correction performed by the logarithmic/inverse-logarithmic conversion circuit shown in FIG. 5.

First Embodiment

Figure 1:
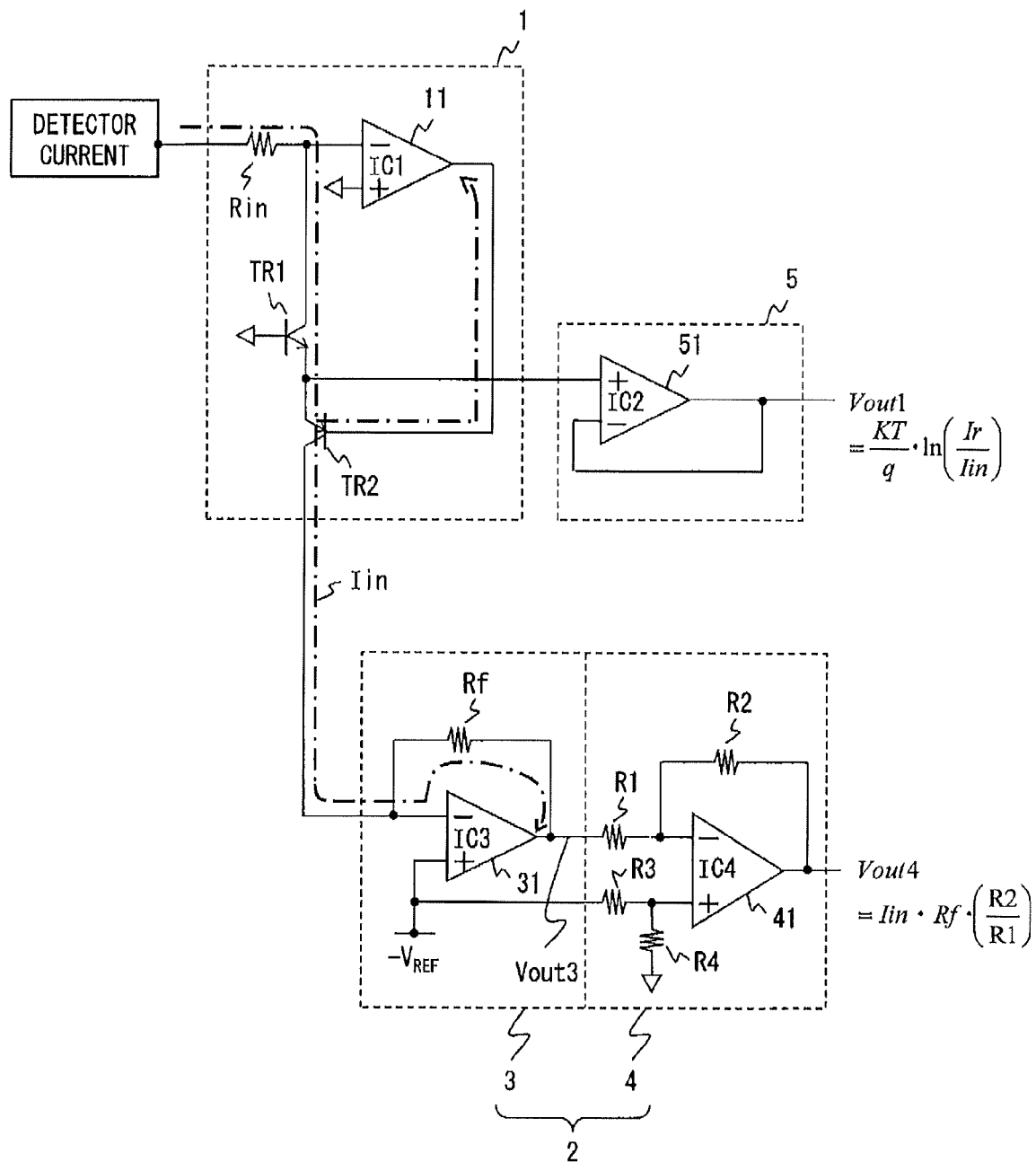
FIG. 1 is a circuit diagram showing the configuration of a logarithmic/inverse-logarithmic conversion circuit according to the first embodiment of the present invention.

FIG. 1 is a circuit diagram showing the configuration of a logarithmic/inverse-logarithmic conversion circuit according to the first embodiment of the present invention.

The logarithmic/inverse-logarithmic conversion circuit of the first embodiment comprises a logarithmic conversion circuit 1 and an inverse-logarithmic conversion circuit 2. A pulse signal outputted from a radiation detector or the like is converted to a current value corresponding to the pulse count, and the resultant current signal (here, particularly, a positive current signal) is inputted to the logarithmic conversion circuit 1. The logarithmic conversion circuit 1 performs logarithmic conversion for the inputted current signal and outputs the resultant current signal. The inverse-logarithmic conversion circuit 2 performs inverse-logarithmic conversion for the current signal that has passed through the logarithmic conversion circuit 1, and outputs the resultant current signal.

The logarithmic conversion circuit 1 comprises an operation amplifier 11. An input resistor Rin is connected at a preceding stage of the inverting input terminal, of the operation amplifier 11, to which a current signal is inputted. A transistor TR1 of NPN type as a device for logarithmic conversion, and a transistor TR2 of PNP type as a device for current feedback are connected in series between the inverting input terminal and the output terminal of the operation amplifier 11. It is noted that although the transistor TR1 is used as a device for logarithmic conversion here, the present invention is not limited thereto. A diode may be used instead.

The inverse-logarithmic conversion circuit 2 comprises a current/voltage conversion circuit 3 and a subtraction circuit 4. A current signal that has passed through the transistor TR2 is inputted to the current/voltage conversion circuit 3. The current/voltage conversion circuit 3 converts the inputted current signal to a voltage value corresponding thereto. The subtraction circuit 4 outputs the difference between the output voltage of the current/voltage conversion circuit 3 and a predetermined reference voltage.

The current/voltage conversion circuit 3 of the inverse-logarithmic conversion circuit 2 comprises an operation amplifier 31. The current signal Iin that has passed through the transistors TR1 and TR2 of the logarithmic conversion circuit 1 is inputted to the inverting input terminal of the operation amplifier 31. A current feedback resistor Rf is connected between the inverting input terminal and the output terminal of the operation amplifier 31. A reference voltage source $(-V_{REF})$ is connected to the non-inverting input terminal of the operation amplifier 31.

The subtraction circuit 4 comprises an operation amplifier 41. The output terminal of the current/voltage conversion circuit 3 is connected to the inverting input terminal of the operation amplifier 41 via an input resistor R1, and a resistor R2 is connected between the inverting input terminal and the output terminal. The reference voltage source $(-V_{REF})$ is connected to the non-inverting input terminal of the operation amplifier 41 via an input resistor R3. A voltage division resistor R4 is connected between the input resistor R3 and the non-inverting input terminal of the operation amplifier 41.

A non-inverting amplifier circuit (here, particularly, a buffer circuit 5 functioning as a voltage follower with a gain of 1) composed of an operation amplifier 51 is connected to the connection point between the transistors TR1 and TR2 of the logarithmic conversion circuit 1.

Next, the operation of the logarithmic/inverse-logarithmic conversion circuit having the above configuration will be described.

The positive current signal Iin inputted from the radiation detector or the like flows in the transistor TR1 via the input resistor Rin through the inverting input terminal of the operation amplifier 11 of the logarithmic conversion circuit 1, whereby a logarithmic-converted voltage due to the base-emitter characteristic of the transistor TR1 is outputted. The output voltage Vout1 obtained by the logarithmic conversion is represented as expression (1) previously described. The output voltage Vout1 obtained by the logarithmic conversion in the logarithmic conversion circuit 1 is outputted via the buffer circuit 5.

In addition, the positive current signal Iin that has passed through the transistors TR1 and TR2 of the logarithmic conversion circuit 1 flows into the inverse-logarithmic conversion circuit 2. Here, in the current/voltage conversion circuit 3, the output voltage of the operation amplifier 31 is represented as the following expression, where Vout3 is the output voltage.

$$Vout3 = -Iin \cdot Rf - V_{REF} \quad (3)$$

The output voltage Vout3 of the current/voltage conversion circuit 3 is applied to the inverting input terminal of the operation amplifier 41 of the subtraction circuit 4 via the input resistor R1. In addition, the voltage of the reference voltage source ($-V_{REF}$) is applied to the non-inverting input terminal of the operation amplifier 41 via the input resistor R3. Therefore, the output voltage of the subtraction circuit 4 is represented as the following expression, where Vout4 is the output voltage.

$$Vout4 = -(R2/R1) \cdot Vout3 - (R4/R3) \cdot V_{REF} \quad (4)$$

By substituting expression (3) into expression (4), the following expression is obtained.

$$Vout4 = -(R2/R1) \cdot (-Iin \cdot Rf - V_{REF}) - (R4/R3) \cdot V_{REF} \quad (5)$$

Here, the resistances R1 to R4 which determine the circuit constant of the subtraction circuit 4 are set in advance as R1=R3 and R2=R4. In this case, expression (5) is as follows.

$$Vout4 = -(R2/R1) \cdot (-Iin \cdot Rf - V_{REF}) - (R2/R1) \cdot V_{REF} \quad (6)$$
$$= (R2/R1) \cdot Iin \cdot Rf$$

That is, although in the circuit shown in FIG. 5, the output voltage Vout2 obtained by inverse-logarithmic conversion includes a term of the temperature T as shown in expression (2), in the first embodiment, the difference output Vout4 of the subtraction circuit 4 does not include a term of the temperature T as shown in expression (6), thus having a linearity proportional to the current signal Iin.

Therefore, the linearity of the output voltage Vout4 obtained by inverse-logarithmic conversion can be always kept without temperature correction. Thus, it becomes possible to reduce conventional extra time and work for temperature correction, and obtain a highly accurate detection result.

Second Embodiment

Figure 2:
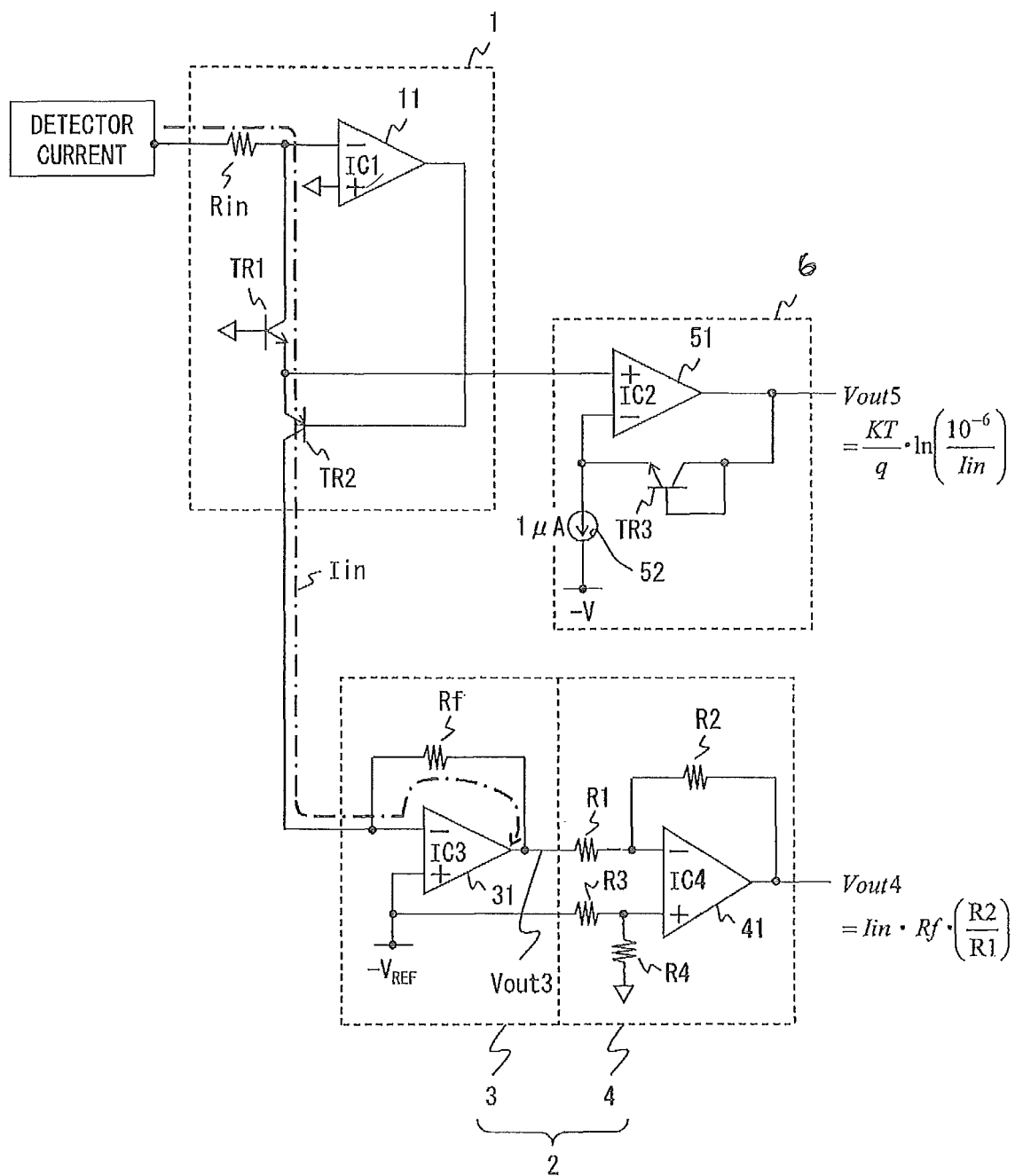
FIG. 2 is a circuit diagram showing the configuration of a logarithmic/inverse-logarithmic conversion circuit according to the second embodiment of the present invention.

FIG. 2 is a circuit diagram showing the configuration of a logarithmic/inverse-logarithmic conversion circuit according to the second embodiment of the present invention. It is noted that components that correspond to or are the same as those of the first embodiment shown in FIG. 1 are denoted by the same reference numerals and characters.

A feature of the second embodiment is that the configuration of the non-inverting amplifier circuit 6 connected to the connection point between the transistors TR1 and TR2 of the logarithmic conversion circuit 1 is different from that of the first embodiment.

The non-inverting amplifier circuit 6 comprises the operation amplifier 51. A transistor TR3 of NPN type as a unidirectional conduction device for current feedback is connected between the inverting input terminal and the output terminal of the operation amplifier 51, and a constant current source circuit 52 is connected to the connection point between the inverting input terminal and the transistor TR3. Here, the constant current source circuit 52 is set such that a constant current of $10^{-6}$ A flows, for example.

It is noted that although the transistor TR3 is used in the non-inverting amplifier circuit 6, a diode may be used instead of the transistor.

Here, the output voltage of the logarithmic conversion circuit 1 is represented as expression (1) previously described with reference to FIG. 5. If the characteristics are matched in advance such that the interrupting current Ir between the collector and the base of the transistor TR1 for logarithmic conversion is equal to that of the transistor TR3 for current feedback, the output voltage Vout5 of the non-inverting amplifier circuit 6 is represented as the following expression.

$$Vout5 = Vout1 - (KT/q) \cdot \ln(Ir/10^{-6}) \quad (7)$$
$$= (KT/q) \cdot \ln(Ir/Iin) - (KT/q) \cdot \ln(Ir/10^{-6})$$
$$= (KT/q) \cdot \ln(10^{-6}/Iin)$$

As shown in expression (7), if the characteristics are matched in advance such that the interrupting current Ir between the collector and the base of the transistor TR1 for logarithmic conversion is equal to that of the transistor TR3 for current feedback, a term of the interrupting current Ir is not included in the expression, and a fixed value of $10^{-6}$ replaces the interrupting current Ir. Therefore, the accuracy of the output voltage Vout5 obtained by logarithmic conversion is not influenced by characteristic variations of the transistors TR1 and TR2 of the logarithmic conversion circuit 1, thus increasing the accuracy of the output voltage Vout5 obtained by logarithmic conversion.

Since the other configuration, and the other operations and effects are the same as in the first embodiment, the detailed description thereof is omitted.

Third Embodiment

Figure 3:
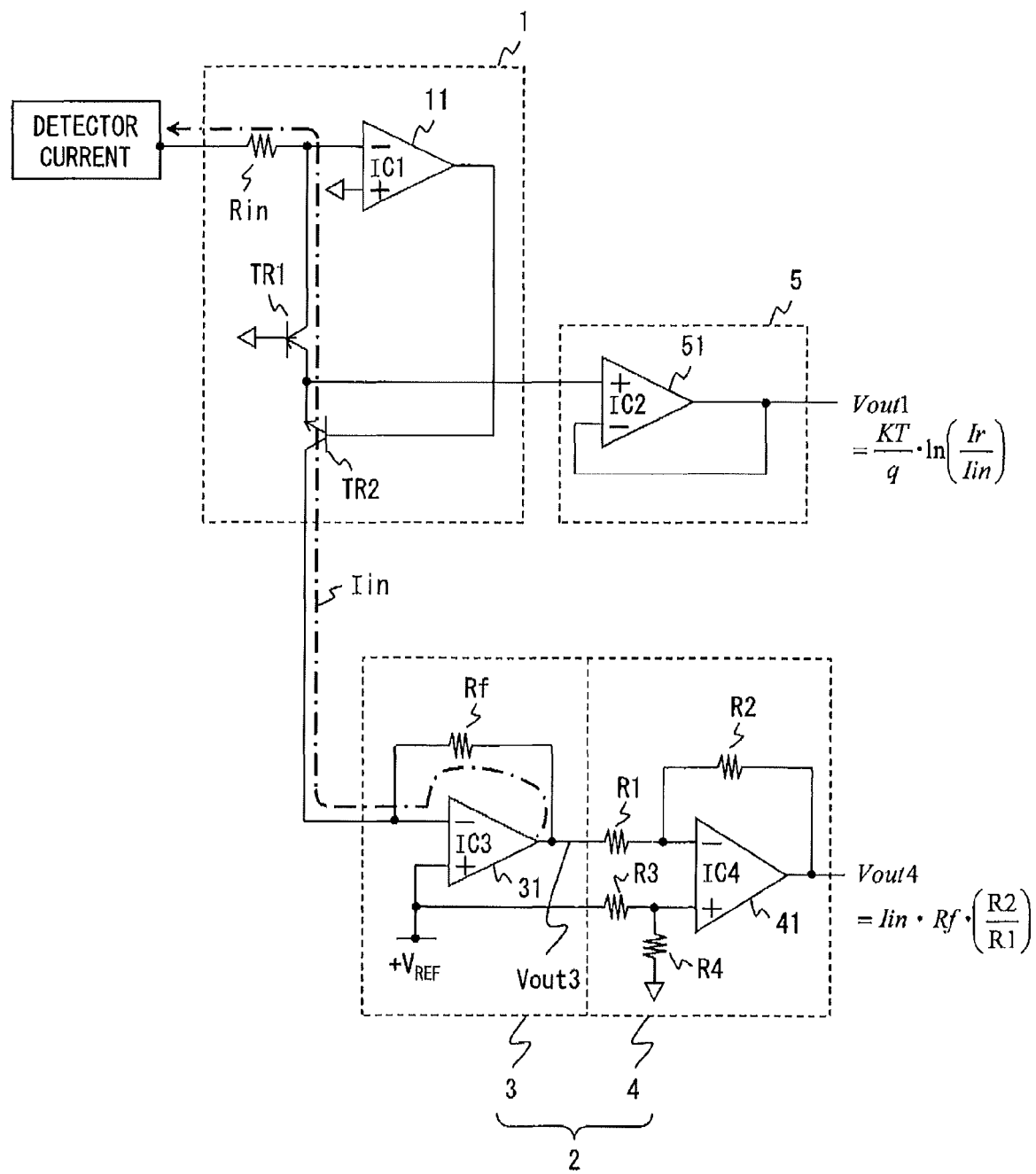
FIG. 3 is a circuit diagram showing the configuration of a logarithmic/inverse-logarithmic conversion circuit according to the third embodiment of the present invention.

FIG. 3 is a circuit diagram showing the configuration of a logarithmic/inverse-logarithmic conversion circuit according to the third embodiment of the present invention. It is noted that components that correspond to or are the same as those of the first embodiment shown in FIG. 1 are denoted by the same reference numerals and characters.

In the first embodiment and the second embodiment, the current signal Iin from the radiation detector or the like has a positive polarity. On the other hand, if the current signal has an opposite polarity, that is, if a negative current signal is inputted, the transistors TR1 and TR2 having polarities opposite to those of the first embodiment are used as a device for logarithmic conversion and a device for current feedback, respectively, in accordance with the opposite polarity of the current signal.

That is, in the first embodiment and the second embodiment, the transistor TR1 of NPN type is used as a device for logarithmic conversion, and the transistor TR2 of PNP type is used as a device for current feedback. On the other hand, in the third embodiment, as shown in FIG. 3, the transistor TR1 of PNP type is used as a device for logarithmic conversion, and the transistor TR2 of NPN type is used as a device for current feedback.

In addition, although in the first embodiment and the second embodiment, the reference voltage source used in the inverse-logarithmic conversion circuit 2 is set at $-V_{REF}$, in the third embodiment, the reference voltage source is set at the opposite polarity value, $+V_{REF}$.

As described above, owing to the configuration of the third embodiment, even if the current signal Iin from the radiation detector or the like has a negative polarity, the linearity of the output voltage Vout4 obtained by inverse-logarithmic conversion in the inverse-logarithmic conversion circuit 2 can be always kept without temperature correction, as in the first embodiment. Thus, it becomes possible to reduce conventional extra time and work for temperature correction, and obtain a highly accurate detection result.

Since the other configuration, and the other operations and effects are the same as in the first embodiment, the detailed description thereof is omitted.

Fourth Embodiment

Figure 4:
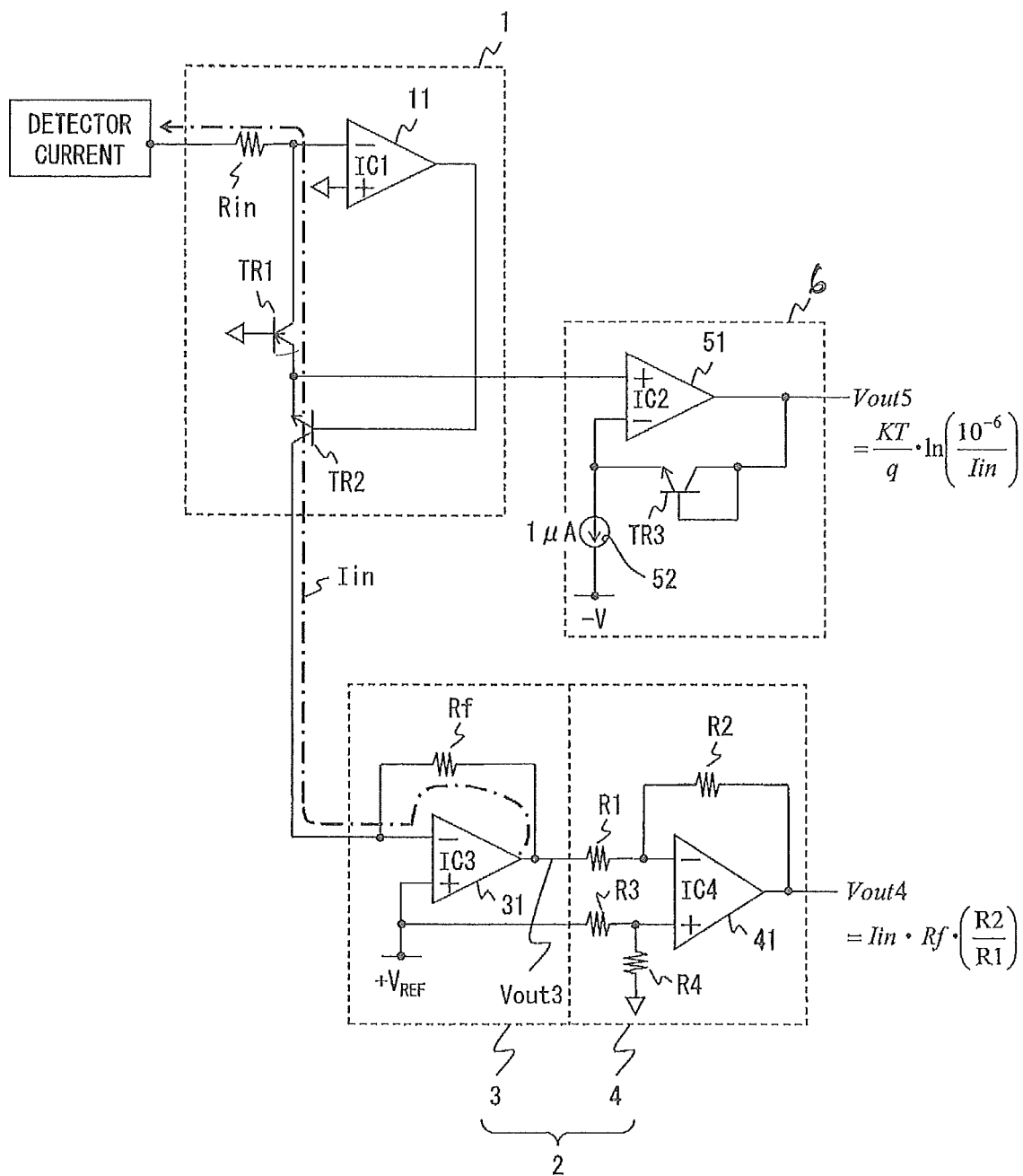
FIG. 4 is a circuit diagram showing the configuration of a logarithmic/inverse-logarithmic conversion circuit according to the fourth embodiment of the present invention.

FIG. 4 is a circuit diagram showing the configuration of a logarithmic/inverse-logarithmic conversion circuit according to the fourth embodiment of the present invention. It is noted that components that correspond to or are the same as those of the third embodiment shown in FIG. 3 are denoted by the same reference numerals and characters.

Basically, the configuration of the fourth embodiment is directed to the case where the current signal Iin from the radiation detector or the like has a negative polarity, as in the third embodiment. A feature of the fourth embodiment is that the configuration of the non-inverting amplifier circuit 6 connected to the connection point between the transistors TR1 and TR2 of the logarithmic conversion circuit 1 is different from that of the third embodiment but the same as that of the second embodiment (FIG. 2).

In the fourth embodiment, even if the inputted current signal Iin has a negative polarity, temperature correction does not need to be performed for the output voltage Vout4 obtained by inverse-logarithmic conversion in the inverse-logarithmic conversion circuit 2, and in addition, the accuracy of the output voltage Vout5 obtained by logarithmic conversion is not influenced by characteristic variations of the transistors TR1 and TR2.

Since the other configuration, and the other operations and effects are the same as in the third embodiment, the detailed description thereof is omitted.

It is noted that, within the scope of the present invention, the above embodiments may be freely combined with each other, or each of the above embodiments may be modified or abbreviated as appropriate.

Various modifications and alterations of this invention will be apparent to those skilled in the art without departing from the scope and spirit of this invention, and it should be understood that this is not limited to the illustrative embodiments set forth herein.

What is claimed is:

1. A logarithmic/inverse-logarithmic conversion circuit comprising:
   a logarithmic conversion circuit which performs logarithmic conversion for an inputted current signal and outputs a logarithmic converted current signal; and
   an inverse-logarithmic conversion circuit which performs inverse-logarithmic conversion for the logarithmic converted current signal that has passed through the logarithmic conversion circuit and outputs a resultant current signal, wherein
   the logarithmic conversion circuit comprises: an operation amplifier; an input resistor connected to an inverting input terminal of the operation amplifier, to which the current signal is inputted; and a logarithmic conversion device and a current feedback device connected in series between the inverting input terminal and an output terminal of the operation amplifier,
   the inverse-logarithmic conversion circuit comprises: a current/voltage conversion circuit to which the logarithmic converted current signal that has passed through the current feedback device is inputted and which converts the logarithmic converted current signal to a voltage value corresponding to the logarithmic converted current signal; and a subtraction circuit which outputs the difference between an output voltage of the current/voltage conversion circuit and a predetermined reference voltage, and
   a circuit constant of the subtraction circuit is set such that the difference output of the subtraction circuit has a linearity proportional to the inputted current signal.

2. The logarithmic/inverse-logarithmic conversion circuit according to claim 1, wherein
   a non-inverting amplifier circuit is connected to the output side of the logarithmic conversion device of the logarithmic conversion circuit, and
   in the non-inverting amplifier circuit, a unidirectional conduction device is connected between an inverting input terminal and an output terminal of an operation amplifier of the non-inverting amplifier circuit, and a constant current source circuit is connected to a connection point between the inverting input terminal and the unidirectional conduction device.

3. The logarithmic/inverse-logarithmic conversion circuit according to claim 1, wherein
   a polarity of the logarithmic conversion device, the current feedback device, and the predetermined reference voltage are determined based on a polarity of the current signal inputted to the logarithmic conversion circuit.

4. The logarithmic/inverse-logarithmic conversion circuit according to claim 3, wherein
   a non-inverting amplifier circuit is connected to the output side of the logarithmic conversion device of the logarithmic conversion circuit, and
   in the non-inverting amplifier circuit, a unidirectional conduction device is connected between an inverting input terminal and an output terminal of an operation amplifier of the non-inverting amplifier circuit, and a constant current source circuit is connected to a connection point between the inverting input terminal and the unidirectional conduction device.

5. The logarithmic/inverse-logarithmic conversion circuit according to claim 1, wherein the logarithmic conversion device and the current feedback device have opposite polarities.

6. The logarithmic/inverse-logarithmic conversion circuit according to claim 1, wherein the predetermined reference voltage and the current signal inputted to the logarithmic conversion circuit have opposite polarities.

* * * * *